(12) United States Patent
Watanabe et al.

(10) Patent No.: US 6,304,502 B1
(45) Date of Patent: *Oct. 16, 2001

(54) SEMICONDUCTOR MEMORY DEVICE CONNECTED TO MEMORY CONTROLLER AND MEMORY SYSTEM EMPLOYING THE SAME

(75) Inventors: Naoya Watanabe; Yoshikazu Morooka, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,227

(22) Filed: Dec. 18, 1998

(30) Foreign Application Priority Data

Jul. 24, 1998 (JP) .................................................. 10-209514

(51) Int. Cl.[7] ....................................................... G11C 7/00
(52) U.S. Cl. ...................... 365/201; 365/189.12; 365/200
(58) Field of Search ..................................... 365/201, 200, 365/189.12; 371/10.2, 10.3

(56) References Cited

U.S. PATENT DOCUMENTS

| | | | |
|---|---|---|---|
| 5,184,327 | * | 2/1993 | Matsuda et al. ...................... 365/201 |
| 5,204,837 | * | 4/1993 | Suwa et al. ............................ 365/201 |
| 5,260,906 | * | 11/1993 | Mizukami ............................. 365/201 |
| 5,293,341 | * | 3/1994 | Tsujimoto ............................. 365/201 |

FOREIGN PATENT DOCUMENTS

| | | |
|---|---|---|
| 7-262791 | 10/1995 | (JP) . |
| 9-293393 | 11/1997 | (JP) . |
| 9-306196 | 11/1997 | (JP) . |

* cited by examiner

Primary Examiner—Son T. Dinh
(74) Attorney, Agent, or Firm—McDermott, Will & Emery

(57) ABSTRACT

Each SLDRAM tests a built in memory section in response to a test execution command supplied from a memory controller and sends a defective address to memory controller. Memory controller stores the defective address of each SLDRAM and accesses only to a normal address and does not access to the defective address. The rate of memory capacity decrease of a main memory can be suppressed compared with a conventional technique where an SLDRAM having a defective address is not accessed.

18 Claims, 21 Drawing Sheets

FIG.4

| CCLK | CA9 | CA8 | CA7 | CA6 | CA5 | CA4 | CA3 | CA2 | CA1 | CA0 |
|---|---|---|---|---|---|---|---|---|---|---|
| 1 | ID8 | ID7 | ID6 | ID5 | ID4 | ID3 | ID2 | ID1 | ID0 | CMD5 |
| 0 | CMD4 | CMD3 | CMD2 | CMD1 | CMD0 | BNK2 | BNK1 | BNK0 | ROW9 | ROW8 |
| 1 | ROW7 | ROW6 | ROW5 | ROW4 | ROW3 | ROW2 | ROW1 | ROW0 | 0 | 0 |
| 0 | 0 | 0 | 0 | COL6 | COL5 | COL4 | COL3 | COL2 | COL1 | COL0 |

FIG.5

| DCLK | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 |
|---|---|---|---|---|---|---|---|---|---|---|---|---|---|---|---|---|
| 1 | BYTE 0 ||||||||| BYTE 1 ||||||||
| 0 | BYTE 2 ||||||||| BYTE 3 ||||||||
| 1 | BYTE 4 ||||||||| BYTE 5 ||||||||
| 0 | BYTE 6 ||||||||| BYTE 7 ||||||||

FIG.9

| CCLK | CA9 | CA8 | CA7 | CA6 | CA5 | CA4 | CA3 | CA2 | CA1 | CA0 |
|---|---|---|---|---|---|---|---|---|---|---|
| 1 | colspan="9" | SLAVE ID | | | | | | | | |
| 0 | colspan="5" | TEST EXECUTION COMMAND | | | | | colspan="4" | SLAVE Sub-ID | | | |
| 1 | colspan="9" | TEST ITEM DESIGNATION | | | | | | | | |
| 0 | colspan="9" | TEST ITEM DESIGNATION | | | | | | | | |

FIG. 10

| DCLK | DQ15 DQ14 DQ13 DQ12 DQ11 DQ10 DQ9 DQ8 DQ7 DQ6 DQ5 DQ4 DQ3 DQ2 DQ1 DQ0 |
|---|---|
| 1 | TEST RESULT (THE NUMBER OF DEFECTIVE BITS) |
| 0 | BANK ADDRESS OF FIRST DEFECTIVE BIT |
| 1 | ROW ADDRESS OF FIRST DEFECTIVE BIT |
| 0 | COLUMN ADDRESS OF FIRST DEFECTIVE BIT |
| 1 | BANK ADDRESS OF SECOND DEFECTIVE BIT |
| 0 | ROW ADDRESS OF SECOND DEFECTIVE BIT |
| 1 | COLUMN ADDRESS OF SECOND DEFECTIVE BIT |
| 0 | ----- |
| 1 | BANK ADDRESS OF nth DEFECTIVE BIT |
| 0 | ROW ADDRESS OF nth DEFECTIVE BIT |
| 1 | COLUMN ADDRESS OF nth DEFECTIVE BIT |
| 0 | |

FIG.12

| ID | TEST RESULT | BANK ADDRESS | ROW ADDRESS | COLUMN ADDRESS |
|---|---|---|---|---|
| 0 | NORMAL | ALL 0 | ALL 0 | ALL 0 |
| 1 | DEFECTIVE | FIRST DEFECTIVE ADDRESS | | |
| ...... | ...... | ...... | ...... | ...... |
| 1 | DEFECTIVE | kth DEFECTIVE ADDRESS | | |
| 2 | DEFECTIVE | FIRST DEFECTIVE ADDRESS | | |
| ...... | ...... | ...... | ...... | ...... |
| n-1 | DEFECTIVE | | | |
| n | DEFECTIVE | FIRST DEFECTIVE ADDRESS | | |
| ...... | ...... | ...... | ...... | ...... |
| n | DEFECTIVE | mth DEFECTIVE ADDRESS | | |

FIG.15

| DCLK | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 |
|---|---|---|---|---|---|---|---|---|---|---|---|---|---|---|---|---|
| 1 | TEST RESULT (THE NUMBER OF DEFECTIVE BANKS) |||||||||||||||||
| 0 | FIRST DEFECTIVE BANK ADDRESS |||||||||||||||||
| 1 | SECOND DEFECTIVE BANK ADDRESS |||||||||||||||||
| 0 | ---------- |||||||||||||||||
| 1 | |||||||||||||||||
| 0 | nth DEFECTIVE BANK ADDRESS |||||||||||||||||

FIG.18

| CCLK | CA9 | CA8 | CA7 | CA6 | CA5 | CA4 | CA3 | CA2 | CA1 | CA0 |
|------|-----|-----|-----|-----|-----|-----|-----|-----|-----|-----|
| 1 | SLAVE ID ||||||||| |
| 0 | TEST EXECUTION COMMAND ||||| SLAVE Sub-ID |||| |
| 1 | DESIGNATION OF MEMORY SECTION OR LOGIC SECTION ||||||||| |
| 0 | TEST ITEM DESIGNATION ||||||||| |

FIG.19

| DCLK | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 | |
|---|---|---|---|---|---|---|---|---|---|---|---|---|---|---|---|---|---|
| 1 | | | | | | | | | | | | | | | | | TEST RESULT OF MEMORY SECTION (THE NUMBER OF DEFECTIVE BITS) |
| 0 | | | | | | | | | | | | | | | | | BANK ADDRESS OF FIRST DEFECTIVE BIT |
| 1 | | | | | | | | | | | | | | | | | ROW ADDRESS OF FIRST DEFECTIVE BIT |
| 0 | | | | | | | | | | | | | | | | | COLUMN ADDRESS OF FIRST DEFECTIVE BIT |
| 1 | | | | | | | | | | | | | | | | | BANK ADDRESS OF SECOND DEFECTIVE BIT |
| 0 | | | | | | | | | | | | | | | | | ROW ADDRESS OF SECOND DEFECTIVE BIT |
| 1 | | | | | | | | | | | | | | | | | COLUMN ADDRESS OF SECOND DEFECTIVE BIT |
| 0 | | | | | | | | | | | | | | | | | ..... |
| 1 | | | | | | | | | | | | | | | | | BANK ADDRESS OF nth DEFECTIVE BIT |
| 0 | | | | | | | | | | | | | | | | | ROW ADDRESS OF nth DEFECTIVE BIT |
| 1 | | | | | | | | | | | | | | | | | COLUMN ADDRESS OF nth DEFECTIVE BIT |
| 0 | | | | | | | | | | | | | | | | | TEST RESULT OF LOGIC SECTION |

FIG.20

| DCLK | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 |
|---|---|---|---|---|---|---|---|---|---|---|---|---|---|---|---|---|
| 1 | TEST RESULT OF FIRST INTERNAL LOGIC CIRCUIT ||||||||||||||||
| 0 | TEST RESULT OF SECOND INTERNAL LOGIC CIRCUIT ||||||||||||||||
| 1 | ...... ||||||||||||||||
| 0 | TEST RESULT OF nth INTERNAL LOGIC CIRCUIT ||||||||||||||||

SEMICONDUCTOR MEMORY DEVICE CONNECTED TO MEMORY CONTROLLER AND MEMORY SYSTEM EMPLOYING THE SAME

BACKGROUND OF THE INVENTION

1. Field of the Invention

The present invention relates to a semiconductor memory device and a memory system employing the same, and more particularly to a semiconductor memory device connected to a memory controller and a memory system employing the same.

2. Description of the Background Art

Conventionally, a memory system employing a Synclink Dynamic Random Access Memory (hereinafter referred to as an SLDRAM) has been developed. This memory system, having a plurality of SLDRAMs connected in parallel corresponding to a memory controller, sequentially transfers data in synchronization with a clock signal. Therefore a high speed data transfer is allowed.

Japanese Patent Laying-Open No. 9-293393 discloses a technique for repairing (utilizing without discarding) a memory system when a defective SLDRAM is found after memory system completion. According to this technique, a built in test circuit, provided with each SLDRAM, tests a corresponding SLDRAM at system initialization to determine whether the SLDRAM is normal or not and transfers a test result to the memory controller. Hence, an ID value is not given to a defective SLDRAM and the memory controller is prevented from accessing to a defective SLDRAM, whereby system malfunction is prevented.

In a conventional technique, however, memory system performance is significantly deteriorated by an existence of even a single defective bit in an SLDRAM. An access to an SLDRAM is inhibited if one defective bit exists in the SLDRAM, that is, one defective bit in an SLDRAM means a loss of entire memory capacity of the SLDRAM from the memory system capacity.

SUMMARY OF THE INVENTION

A main object of the present invention is to provide a semiconductor memory device and a memory system allowing an efficient system utilization (repair) even when a defective address is found after the memory system completion and being capable of suppressing memory capacity decrease.

According to one aspect of a semiconductor memory device of the present invention, a first memory circuit tests each memory cell in the memory circuit to determine whether it is normal or not in response to a first test execution command and provides a test result information including an address of a defective memory cell to a memory controller. Therefore the memory controller can access only to a normal memory cell other than a defective memory cell even when a defect is developed in a memory cell after system completion. Therefore the rate of memory capacity decrease of the memory system can be suppressed compared with a conventional technique where an access is inhibited to a semiconductor memory device having a memory cell which becomes defective after memory system completion.

Preferably, the test result information further includes the number of defective memory cells. In this case, as the memory controller can confirm the number of defective memory cells, the test result information can be processed correctly and quickly.

According to another aspect of a semiconductor memory device of the present invention, a first memory circuit tests each memory cell in each memory circuit to determine whether it is normal or not in response to a first test execution command and provides a test result information including an address of a defective memory circuit having a defective memory cell to a memory controller. Therefore the memory controller can access only to a normal memory circuit other than a defective memory circuit even when a memory circuit is made defective after system completion. Therefore the rate of memory capacity decrease of the memory system can be suppressed compared with a conventional technique where an access is inhibited to a semiconductor memory device having a memory cell made defective after memory system completion.

Preferably, the test result information further includes the number of defective memory circuits. In this case, the memory controller can confirm the number of defective memory circuits, whereby correct and rapid processing of the test result information is allowed.

Preferably, the first test circuit temporarily stores the test result information and supplies it to the memory controller in response to a test result output command sent from the memory controller. When a plurality of a semiconductor memory devices are connected to the memory controller, the plurality of semiconductor memory devices can be tested at the same time and a test result of each semiconductor memory device can be sequentially transferred to the memory controller, whereby test time can be shortened.

Preferably, the semiconductor memory device further includes a logic circuit processing data between the memory controller and the memory circuit and a second test circuit testing the logic circuit to determine whether it is normal or not in response to a second test execution command sent from the memory controller and providing a test result to the memory controller, and the memory circuit and the logic circuit are separately usable from the memory controller side. Hence, when only the logic circuit is defective, the semiconductor memory device can be used as a memory circuit and when only the memory circuit is defective, the semiconductor memory device can be used as a logic circuit.

In a memory system of the present invention, the first test circuit of a semiconductor memory device tests each memory cell in the memory circuit to determine whether it is normal or not in response to the first test execution command and supplies the test result information including an address of a defective memory cell to the memory controller, which accesses only a normal memory cell based on the test result information. Therefore the rate of memory capacity decrease of the memory system can be suppressed compared with a conventional technique where an access is inhibited to a semiconductor memory device having a memory cell made defective after memory system completion.

Preferably, the test result information further includes the number of defective memory cells. In this case, as the memory controller can confirm the number of defective memory cells, the test result information can be processed correctly and quickly.

Preferably, the memory controller includes a register for storing the test result information provided from the first test circuit, and an address generation circuit generating only an address corresponding to a normal memory cell in the memory circuit based on an externally supplied external address and the test result information stored in the register, and providing the address to a read/write circuit. Thus the memory controller can be easily configured.

Preferably, the first test circuit temporarily stores the test result information and supplies it to the memory controller in response to a test result output command sent from the memory controller. When a plurality of a semiconductor memory devices are connected to the memory controller, the plurality of semiconductor memory devices can be tested at the same time and a test result of each semiconductor memory device can be sequentially transferred to the memory controller, whereby test time can be shortened.

Preferably, the semiconductor memory device further includes a logic circuit processing data between the memory controller and the memory circuit and a second test circuit testing the logic circuit to determine whether it is normal or not in response to a second test execution command sent from the memory controller and providing a test result to the memory controller, and the memory circuit and the logic circuit are separately usable from the memory controller side. Hence, when only the logic circuit is defective, the semiconductor memory device can be used as a memory circuit and when only the memory circuit is defective, the semiconductor memory device can be used as a logic circuit.

Still preferably, there is a plurality of semiconductor memory devices, each being allocated a unique identifier, and each semiconductor memory device is activated in response to a corresponding identifier sent from the memory controller. Then, a high speed data transfer is allowed by connecting the plurality of semiconductor memory devices with the memory controller.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing a configuration of a command packet shown in

FIGS. 3A–3D.

FIG. 5 is a diagram showing a configuration of a data packet shown in FIGS. 3A–3D.

FIG. 9 is a diagram showing a configuration of a test execution packet shown in FIGS. 8A–8D.

FIG. 10 is a diagram showing a configuration of a test result packet shown in FIGS. 8A–8D.

FIG. 12 is a diagram referenced for describing a memory status register shown in FIG. 11.

FIG. 15 is a diagram showing another variation of the first embodiment.

FIG. 18 is a diagram showing a configuration of a test execution packet sent to the SLDRAM shown in FIG. 17.

FIG. 19 is a diagram showing a configuration of a test result packet supplied as an output from the SLDRAM shown in FIG. 17.

FIG. 20 is a diagram showing a variation of the second embodiment.

DESCRIPTION OF THE PREFERRED EMBODIMENTS

First Embodiment

Figure 1:
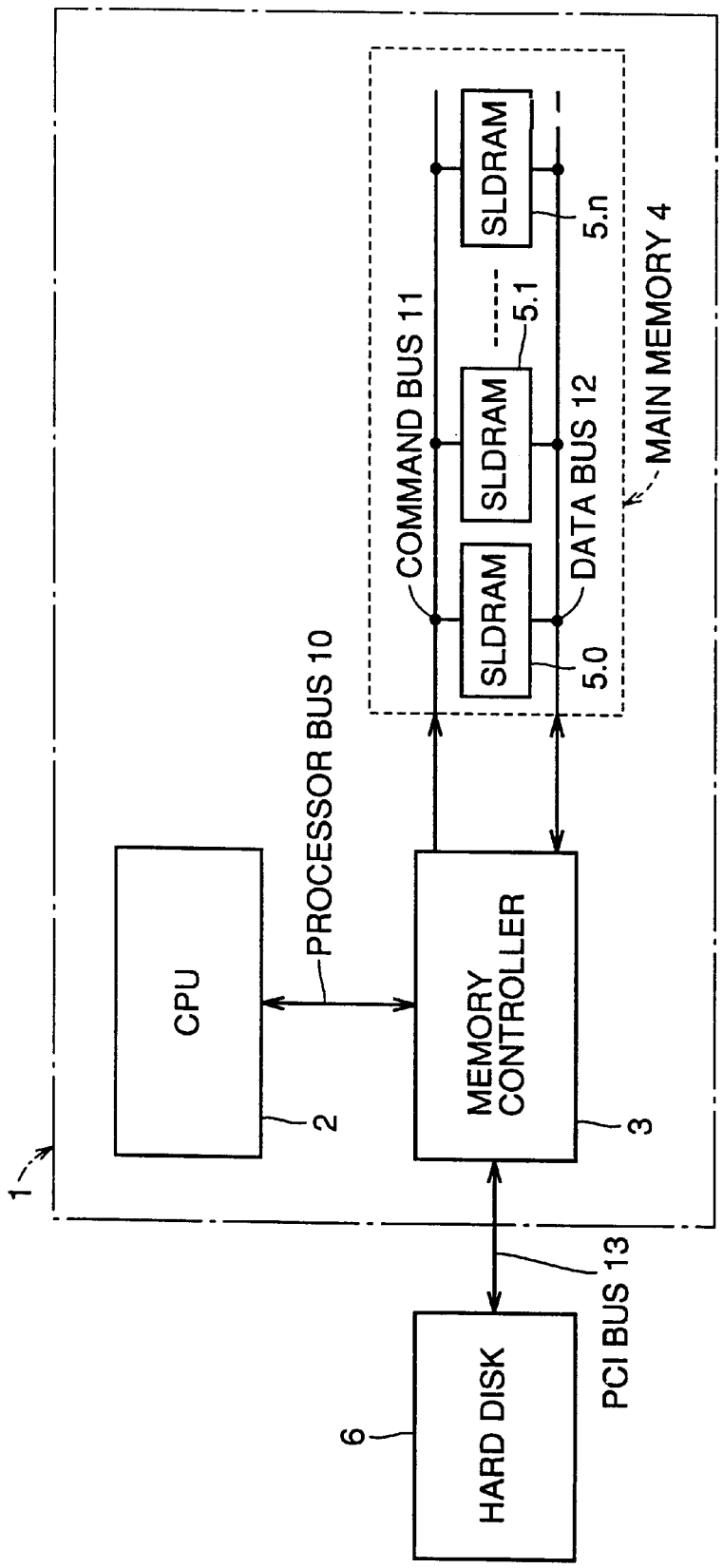
FIG. 1 is a block diagram showing a configuration of a computer system in accordance with a first embodiment of the present invention.

With reference to FIG. 1, the computer system includes a personal computer 1 and a hard disk 6. Personal computer 1 includes a CPU (Central Processing Unit) 2, a memory controller 3 and a main memory 4.

CPU 2 supplies commands such as a data load, a data store and so on to memory controller 3 via a processor bus 10. Upon receiving the data load command from CPU 2, memory controller 3 sends a read command to main memory 4 via a command bus 11 and reads data from main memory 4 via a data bus 12 when data is in main memory 4, and reads data from hard disk 6 via a PCI bus 13 when data is not in main memory 4. Upon receiving the data store command from CPU 2, memory controller 3 sends a write command to main memory 4 via command bus 11 and writes data into main memory 4 via data bus 12 when data can be stored in main memory 4, and stores data in hard disk 6 when main memory 4 is not available.

Though small in memory capacity compared with hard disk 6, main memory 4 operates fast. Therefore, a fast access and an efficient system operation is allowed by moving data from hard disk 6 to main memory 4. In this example, CPU 2, memory controller 3 and main memory 4 are implemented on the same board.

Figure 2:
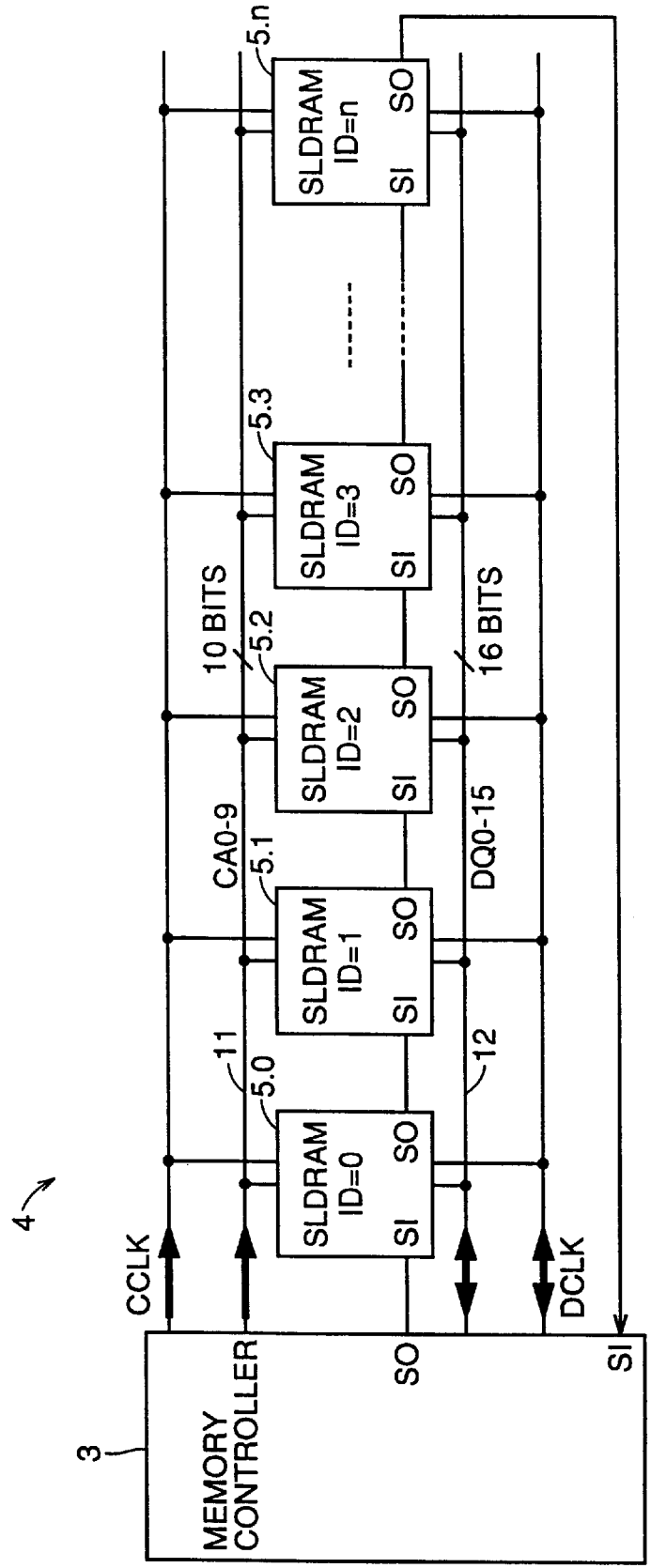
FIG. 2 is a block diagram showing a configuration of a main memory shown in FIG. 1.

With reference to FIG. 2, main memory 4 includes n+1 (n is a natural number) SLDRAMs 5.0–5.n connected in parallel between command bus 11 and data bus 12. Command bus 11 is 10-bit wide and data bus 12 is 16-bit wide. Memory controller 3 and each one of SLDRAMs 5.0–5.n operate synchronously with clock signals CCLK and DCLK.

SLDRAMs 5.0–5.n are each allocated a unique identifier (slave ID). The ID values of SLDRAMs 5.0–5.n are set by controller 3 at system initialization. A smaller value is given to an SLDRAM nearer to controller 3.

Controller 3 and SLDRAMs 5.0–5.n each include a select input node SI and a select output node SO. The select output node SO of controller 3 is connected to the select input node SI of SLDRAM 5.0 of a first stage and the select output nodes SOs of SLDRAMs 5.0–5.n−1 are connected to the select input nodes SIs of SLDRAMs 5.1–5.n of their next stage respectively, and the select output node SO of SLDRAM 5.n of the last stage is connected to the select input node SI of controller 3.

When the select input node SI and the select output node SO are respectively at a logical "H" level and a logical "L" level, each of SLDRAMs 5.0–5n–1 can take an ID value given through command bus 11. Each of SLDRAMs 5.0–5.n maintains the select output node SO at an "L" level while the slave ID is at an initial value (e.g. 255).

After initializing SLDRAMs 5.0–5.n, controller 3 turns the select output node SO to an "H" level and supplies as an output an ID value "0" to command bus 11. The first stage SLDRAM 5.0, with an "H" level select input node SI and an "L" level select output node SO, updates the initial slave ID value (255) to "0" and turns the select output node SO to an "H" level.

Then controller 3 supplies "1" as an output to command bus 11. The second stage SLDRAM 5.1, with an "H" level select input node SI and an "L" level select output node SO, then updates the initial slave ID value (255) to "1" and turns the select output node SO to an "H" level. The slave ID values of SLDRAMs 5.0–5.n are set 0–n, respectively, in this manner.

FIGS. 3A–3D are timing charts showing a reading operation of the computer system shown in FIGS. 1 and 2. Referring to FIGS. 3A–3D, a slave ID, a command and an address are transferred as a packet from memory controller 3 to SLDRAMs 5.0–5.n via command bus 11 in synchronization with rises and falls of clock signal CCLK.

As shown in FIG. 4, a command packet includes a slave ID value (ID8–ID0), a command (CMD5–CMD0), a bank address (BNK2–BNK0), a row address (ROW9–ROW0) and a column address (COL6–COL0) and is transferred over two clock cycles.

Though in FIG. 4, the ID value is represented by 9 bits, an ID value of each SLDRAM is represented by 8 bits up to 255. Hence, a plurality of SLDRAMs can be selected using an ID value larger than 255 as shown in Table 1. For example, when data refresh for all SLDRAMs 5.0–5.n is to be performed, all SLDRAMs 5.0–5.n are selected by setting an ID value to 511.

TABLE 1

| ID value of packet | ID values of selected SLDRAMs |
|---|---|
| 256 | 0–1 |
| 257 | 0–3 |
| 258 | 2–3 |
| 259 | 0–7 |
| . | . |
| . | . |
| . | . |
| 509 | 252–255 |
| 510 | 254–255 |
| 511 | 0–255 |

At a normal operation, all SLDRAMs 5.0–5.n that have received a command packet, compare an ID value in the packet with a set ID value. If the values match, SLDRAMs 5.0–5.n decode command packet content and execute a command given from memory controller 3.

CMD5–CMD3 represent a main command whereas CMD2–CMD0 represent a sub command. CMD5–CMD3 indicate, for example, a page access (burst length=4) by 0, 0, 0, a page access (burst length=8) by 0, 0, 1, a bank access (burst length=4) by 0, 1, 0, and a bank access (burst length=8) by 0, 1, 1. CMD2–CMD0 indicate, for example, a read access (leave row open) by 0, 0, 0, a read access (close row) by 0, 1, 0, a write access (leave row open) by 1, 0, 0 and a write access (close row) by 1, 1, 0.

Figure 3:
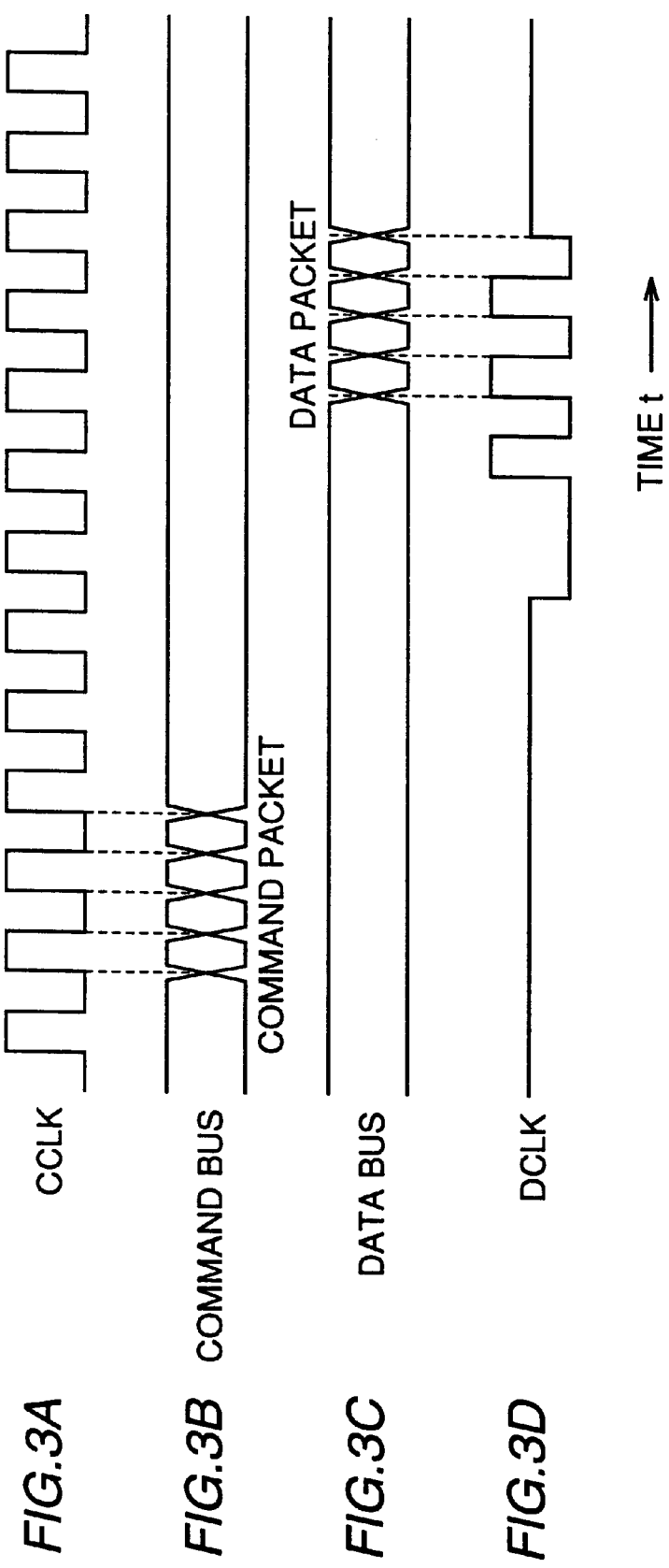
FIGS. 3A–3D are timing charts showing a reading operation of a memory controller and the main memory shown in FIG. 2.

If command packet content is a read access, data is transferred as a packet from a selected SLDRAM to memory controller 3 via data bus 12 in synchronization with rises and falls of clock signal DCLK after a predetermined read latency following a command input as shown in FIG. 3. As can be seen from FIG. 5, the data packet includes 16 bits×4=8 bytes data.

Memory controller 3 and SLDRAMs 5.0–5.n supply as an output clock signal DCLK having the same cycle with clock signal CCLK and being in the same phase with data at the time of data output. Clock signal DCLK is utilized as a clock signal for data input by a device receiving data input. The use of clock signal DCLK widens a timing margin at data input and allows a high speed data transfer.

Figure 6:
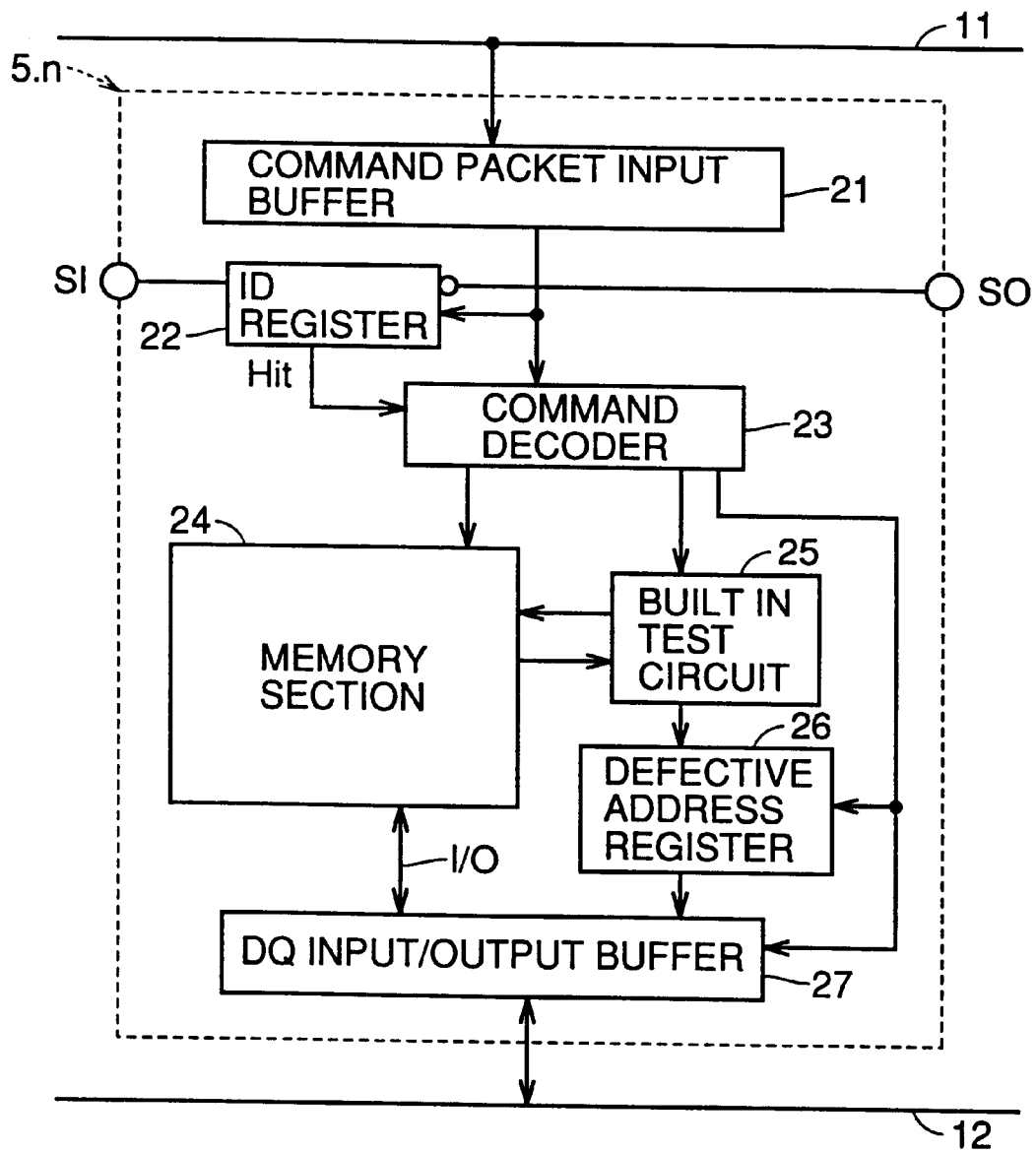
FIG. 6 is a block diagram showing a main portion of an SLDRAM shown in FIG. 2.

A method for an efficient memory system utilization (repair), which is a feature of the present invention, will be described in detail hereinafter. With reference to FIG. 6, SLDRAM 5.n includes a command packet input buffer 21, an ID register 22, a command decoder 23, a memory section 24, a built in test circuit 25, a defective address register 26 and a DQ input/output buffer 27.

Command packet input buffer 21, connected to command bus 11, sends information transmitted on command bus 11 to ID register 22 and command decoder 23. ID register 22 is activated when the select input node SI is at an "H" level and the select output node SO is at an "L" level, and stores a slave ID value supplied via command packet input buffer 21.

Command decoder 23 decodes a command supplied via command packet input buffer 21, determines a designated operating mode, generates a variety of control signals based on the determination, and controls an entire SLDRAM. In addition, command decoder 23 generates an internal address in accordance with an address supplied via command packet input buffer 21 and provides the internal address to memory section 24.

Figure 7:
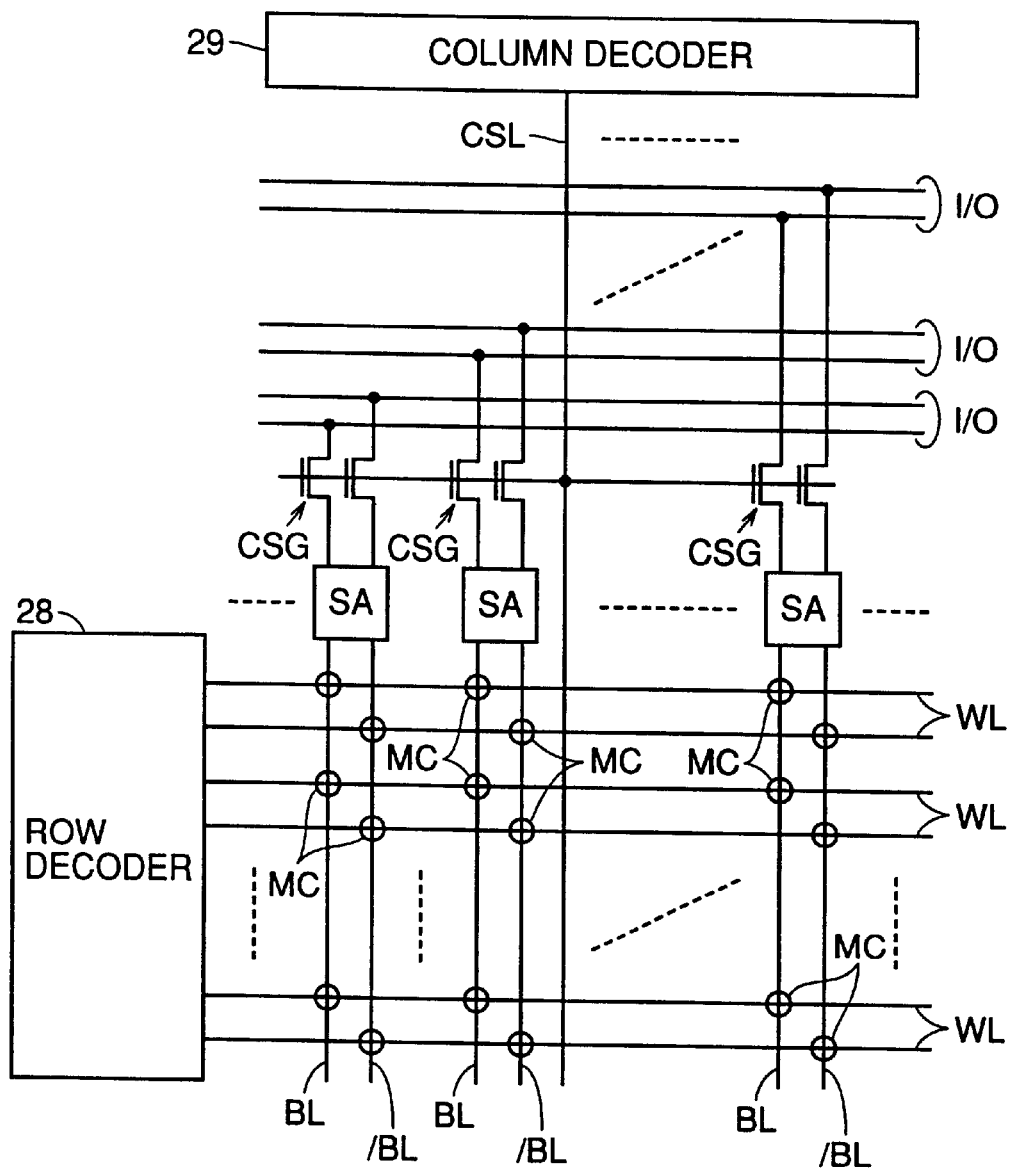
FIG. 7 is a circuit block diagram showing a configuration of a memory section shown in FIG. 6.
Figure 8:
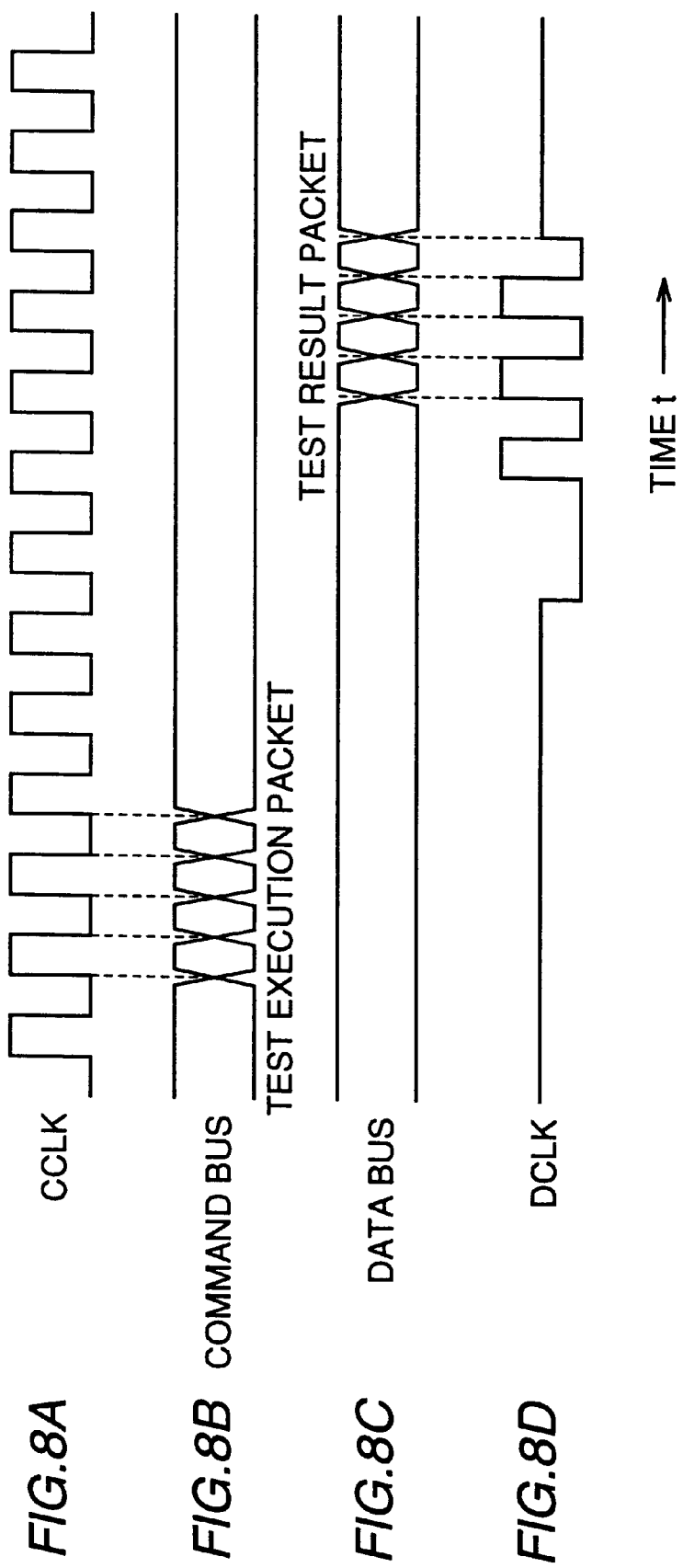
FIGS. 8A–8D are timing charts showing a testing operation of the SLDRAM shown in FIG. 6.

Memory section 24 includes a plurality of (e.g. 8) banks. Each bank includes, as shown in FIG. 7, a row decoder 28; a column decoder 29; a plurality of memory cells MCs arranged in rows and columns; word lines WLs provided corresponding to respective rows; bit line pairs BLs, /BLs, sense amplifiers SAs and column select gates CSGs provided corresponding to respective columns; and a plurality of (e.g. 16) sets of data input/output line pairs I/Os. Memory cell MC is a well known element including a capacitor for storing information and an N channel MOS transistor for access. Each of column select gates CSGs includes two N channel MOS transistors.

Bit line pairs BLs, /BLs, sense amplifiers SAs and column select gates CSGs are divided 16 by 16, into groups in advance, and bit line pair BL, /BL in each group is connected to one end of data input/output line pair I/O via corresponding sense amplifier SA and column select gate CSG. The other end of data input/output line pair I/O is connected to DQ input/output buffer 27.

One column select line CSL is provided for each group. When column select line CSL of the group is turned to an "H" level, which is a select level, column select gate CSG connected to the column select line CSL is rendered conductive, whereby bit line pair BL, /BL of the group is connected to data input/output line pair I/O.

Row decoder 28 selects one word line WL among a plurality of word lines WLs in response to an internal row address supplied from command decoder 23 and turns the state of the word line WL to a selected "H" level. Column decoder 29 selects one column select line CSL among a plurality of column select lines CSLs in response to an internal column address supplied from command decoder 23 and turns the state of the column select line CSL to a selected level of "H".

At the writing operation, a bank corresponding to bank address BNK2–BNK0 is selected and at the selected bank a column select line CSL in a group corresponding to column address COL6–COL0 is rendered a selected "H" level by column decoder 29, whereby column select gate CSG of the group is rendered conductive. Then a write data given via DQ input/output buffer 27 is supplied to bit line pair BL, /BL of the selected group via data input/output line pair I/O. Then, word line WL corresponding to row address ROW9–ROW0 is turned to a selected "H" level by row decoder 28, and a memory cell MC corresponding to the word line WL is activated. To the memory cell MC thus activated, data from corresponding bit line pair BL, /BL is written in the form of electric charges.

At the reading operation, a bank corresponding to bank address BNK2–BNK0 is selected and at the selected bank, after potential between each bit line pair BL and /BL is equalized, a word line WL corresponding to row address ROW9–ROW0 is turned to a selected "H" level by row decoder 28. The potential of bit line pair BL, /BL changes by a minor amount corresponding to data of an activated memory cell MC. Then with the activation of sense amplifier SA, the potential of one bit line of the bit line pair BL, /BL with the higher potential is pulled up to a supply potential VCC and the potential of the other bit line is pulled down to a ground potential GND.

Then, as a column select line CSL of the group corresponding to column addresses COL6–COL0 is pulled up to a selected "H" level by column decoder 29, column select gate CSG of the group is rendered conductive. Data from bit line pair BL, /BL of the selected group is supplied to DQ input/output buffer 27 via column select gate CSG and data input/output line pair I/O.

Built in test circuit 25, coupled to row decoder 28, column decoder 29 and data input/output line pairs I/Os of each bank in memory section 24, determines whether each memory cell is normal or not by conducting a writing/reading test for data in each memory cell of memory section 24 in response to a test command given from command decoder 23. Memory cell MC is determined to be normal when write data and read data match and is determined to be defective when they do not match. Built in test circuit 25 gives an address of a defective memory cell to defective address register 26. Defective address register 26 stores an address of a defective memory cell supplied from built in test circuit 25.

DQ input/output buffer 27 sends an address of a defective memory cell stored in defective address register 26 to memory controller 3 via data bus 12 at the time of testing, and, sends a read data given from memory section 24 to memory controller 3 via data bus 12 at the reading operation, and sends data supplied from memory controller 3 to memory section 24 via data bus 12 at the writing operation. SLDRAMs 5.0–5.$n$–1 operate in the same manner as SLDRAM 5.$n$.

FIGS. 8A–8D are timing charts showing the operation of SLDRAMs 5.0–5.$n$ shown in FIGS. 6 and 7. With reference to FIGS. 8A–8D, the test execution command packet is issued from memory controller 3, and an SLDRAM having an ID value included in the packet executes a test and transfers a test result to memory controller 3 via data bus 12. A test is performed at every system initialization at the power on. The test can be performed while the system is not in operation other than the time of system initialization. In addition, a temperature sensor may be provided near an SLDRAM and the test may be performed when a detected temperature exceeds a predetermined temperature because a defect tends to occur at an elevated temperature. At the test, data in main memory 4 is saved in hard disk 6.

As is shown in FIG. 9, the test execution command packet includes a slave ID, a test execution command, a slave Sub-ID and information such as a designated test item. The test execution command is in such a form as (CMD5, . . . , CMD0)=(1, 1, 1, 0, 0, 0). The slave Sub-ID is an ID value of lower order than the slave ID and is allocated to each circuit block in an SLDRAM.

Each SLDRAM receives the test execution command packet via command bus 11 and compares an ID value in each internal ID register 22 with an ID value in the packet. If they do not match, the processing of the command packet terminates and the SLDRAM turns to a waiting condition for a next command packet input. If the ID values match, it starts to decode command in the command packet. If the content of the command packet turns out to be a test execution instruction as a result of decoding, command decoder 23 sends an operation start signal to built in test circuit 25 and memory section 24 is tested. For test circuit 25 with a plurality of test patterns, a test item is designated by the test execution command packet as can be seen from FIG. 9. Test circuit 25 stores information such as the number of defective bits and the number of defective addresses in defective address register 26. The defect information is transferred to memory controller 3 via data bus 12 as a packet by DQ input/output buffer 27.

As shown in FIG. 10, a test result packet includes the number of defective bits, a bank address of a defective bit, a row address of a defective bit and a column address of a defective bit. Each of these is represented as 16-bit data and is supplied as an output synchronously with rises and falls of clock signal DCLK.

If there is no defective bit, in other words, if the number of defective bits is 0, a test result data packet ends by one output of data of all 0, from DQ0 to DQ15. Therefore, when the number of defective bits is n, test result data packet length is 3n+1. Hence, the packet length can be confirmed by checking the number of defective bits. Memory controller 3 stores defect information about each SLDRAM and operates the system so as not to access to a defective address.

Figure 11:
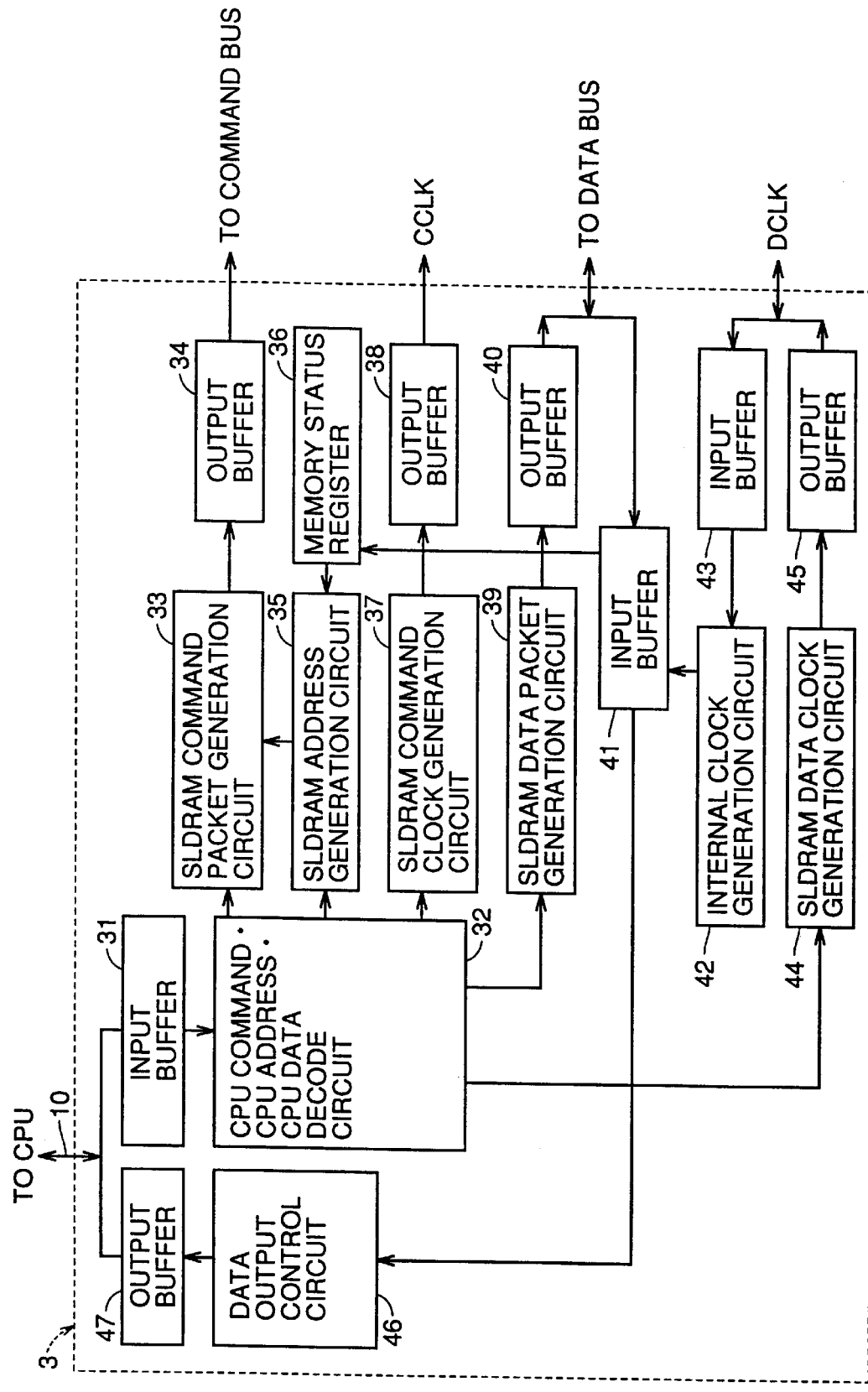
FIG. 11 is a block diagram showing a configuration of the memory controller shown in FIG. 2.

FIG. 11 is a block diagram showing a main portion of memory controller 3. With reference to FIG. 11, memory controller 3 includes input buffers 31, 41, and 43, output buffers 34, 38, 40, 45 and 47, a CPU command·CPU address·CPU data decode circuit 32, an SLDRAM command packet generation circuit 33, an SLDRAM address generation circuit 35, a memory status register 36, an SLDRAM command clock generation circuit 37, an SLDRAM data packet generation circuit 39, an internal clock generation circuit 42, an SLDRAM data clock generation circuit 44 and a data output control circuit 46.

Data supplied as an output from SLDRAMs 5.0–5.$n$ is given to input buffer 41 via data bus 12, and clock signal DCLK supplied as an output from SLDRAMs 5.0–5.$n$ in synchronization with the data is provided to internal clock generation circuit 42 via input buffer 43.

Internal clock generation circuit 42 generates and sends an internal clock signal to input buffer 41 synchronously with clock signal DCLK. Input buffer 41 operating synchronously with the internal clock signal supplied from internal clock generation circuit 42, selectively sends data supplied from SLDRAMs 5.0–5.n to memory status register 36 or data output control circuit 46. An ordinary read data is supplied to CPU 2 via output buffer 47 and processor bus 10 by data output control circuit 46. Test result data is stored in memory status register 36.

As shown in FIG. 12, memory status register 36 stores an ID value, a test result (normal or defective), and a defective address (bank address, row address and column address) for each SLDRAM. For an SLDRAM free from any defective address, a column of defective address is all 0.

Figure 13:
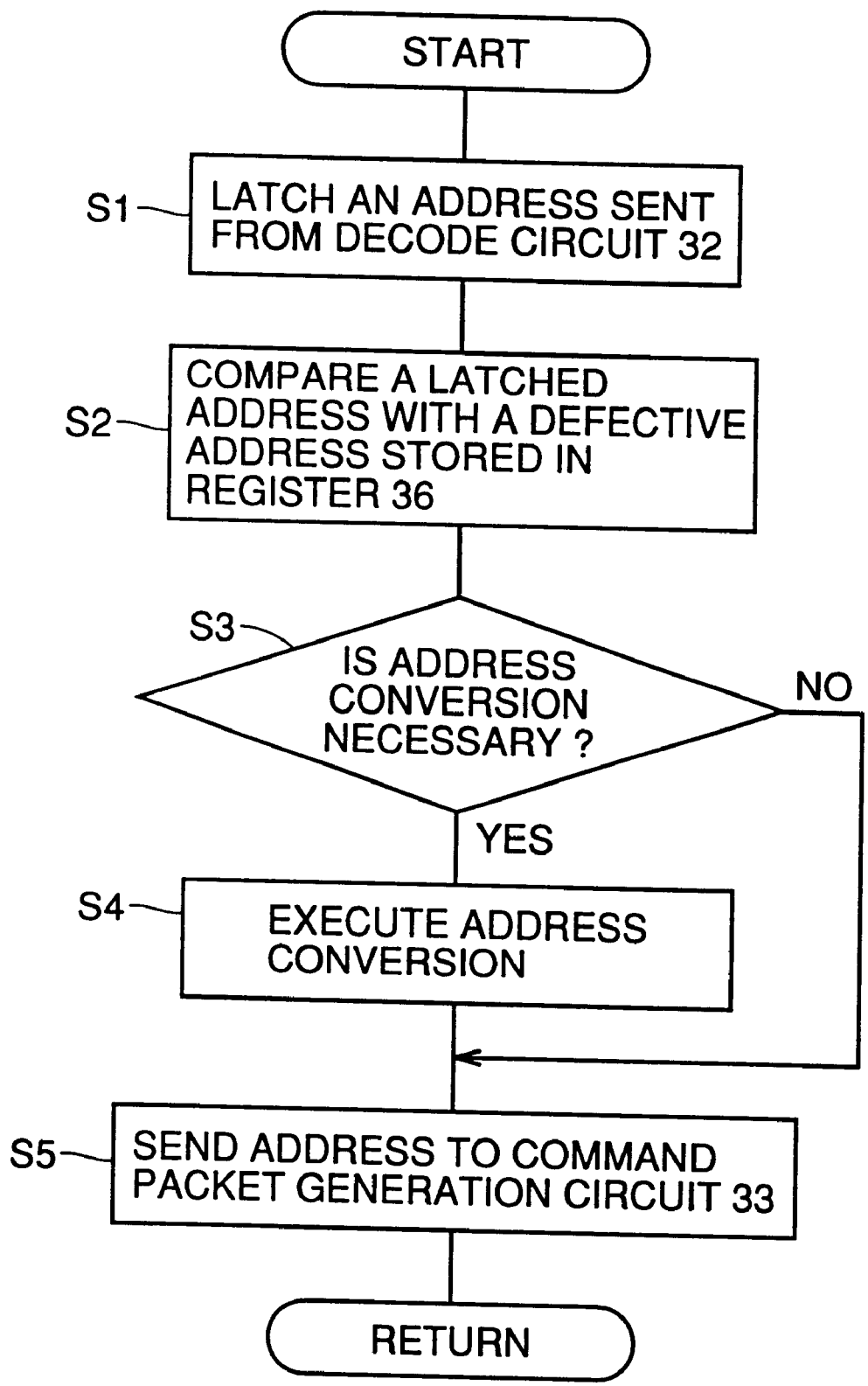
FIG. 13 is a flow chart showing an operation of an SLDRAM address generation circuit shown in FIG. 11.
Figure 14:
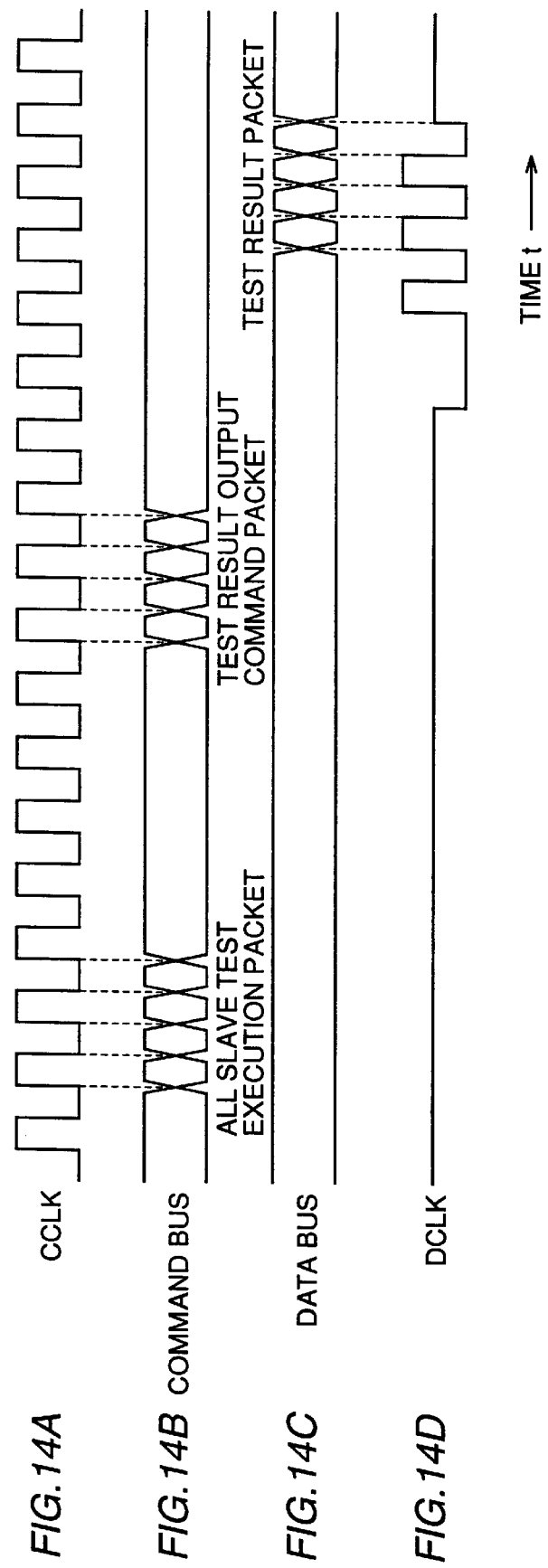
FIGS. 14A–14D are timing charts showing a variation of the first embodiment.

On the other hand, a command, an address and data supplied as an output from CPU 2 are sent to CPU command·CPU address·CPU data decode circuit 32 via processor bus 10 and input buffer 31. Decode circuit 32 decodes and selectively sends a command, an address and data provided from CPU 2 to generation circuits 33, 35, 37, 39 and 44. SLDRAM address generation circuit 35 compares an address given from decode circuit 32 with a defective address stored in memory status register 36 and converts the address if necessary. That is, SLDRAM address generation circuit 35 latches an address supplied from decode circuit 32 at step 1 (S1) as shown in FIG. 13.

Next at S2, address generation circuit 35 compares a latched address with a defective address stored in register 36.

At S3, based on the result of S2, address generation circuit 35 determines whether address conversion is necessary or not. If necessary, the address is converted at S4 and a converted address is given to SLDRAM command packet generation circuit 33 at S5. If the address conversion is determined to be unnecessary at S3, the address is not converted and an original address is given to command packet generation circuit 33 at S5.

The address conversion is performed such that a defective address is skipped. If addresses from (Xn, Yn) to (Xn, Yn+k) are defective, an address (Xn, Yn−1) from decode circuit 32 is given to packet generation circuit 33 without conversion and an address (Xn, Yn) is converted to (Xn, Yn+k+1) and supplied to packet generation circuit 33. Here X indicates a row address and Y indicates a column address.

All the addresses larger than (Xn, Yn) are converted. If an address after conversion exceeds a memory address of an SLDRAM, and if there is an SLDRAM with a next slave ID, this SLDRAM is accessed. If there is no SLDRAM with a next slave ID, hard disk 6 is accessed. Memory controller 3 recognizes memory space of main memory 4 based on the test result, and if the memory space is not sufficient, makes access to hard disk 6.

With reference to FIG. 11, again, SLDRAM command packet generation circuit 33 generates a command packet based on a command given from decode circuit 32 and an address supplied from SLDRAM address generation circuit 35 and sends the command packet to command bus 11 via output buffer 34. SLDRAM command clock generation circuit 37 generates clock signal CCLK in synchronization with the command packet and supplies the clock signal CCLK to SLDRAMs 5.0–5.n via output buffer 38.

SLDRAM data packet generation circuit 39 generates a data packet based on data given from decode circuit 32 and supplies the data packet as an output to data bus 12 via an output buffer 40. SLDRAM data dock generation circuit 44 generates clock signal DCLK in synchronization with the data packet and supplies the clock signal DCLK to SLDRAMs 5.0–5.n via output buffer 45.

In this first embodiment, even if an address is made defective in an SLDRAM of main memory 4, a defective address is skipped and a normal address is accessed. Therefore, the rate of memory capacity decrease of main memory 4 caused by the defective address generation can be suppressed compared with the case where an access to an SLDRAM with a defective address is inhibited. In addition, when the number of defective addresses is small, replacement of the SLDRAM is not necessary therefore replacement cost can be eliminated. In addition, if the number of defective addresses in SLDRAM is small, a memory system can be completed with the defective SLDRAM. Thus by utilizing the defective SLDRAM, system cost can be reduced.

Though in this embodiment, a test is performed and a test result is stored for each SLDRAM, a test for all SLDRAMs 5.0–5.n can be performed at the same time by designating all SLDRAMs 5.0–5.n by setting a slave ID (see Table 1) as shown in FIGS. 14A–14D. In this case, each of all SLDRAMs 5.0–5.n tests memory section 24 in response to the test execution command and store test result in defective address register 26. After the test, memory controller 3 issues the test result output command packet to each SLDRAM and an SLDRAM with a matched ID value sends information in defective address register 26 as a packet to data bus 12.

In addition, by providing a bit for indicating a failure mode, an undesirable fluctuation of power supply bounds, an excessively long access time, timing error, refresh failure and so on can be indicated. Memory controller 3 can effectively utilize SLDRAM by accessing thereto under an operative condition based on these information. For example, if an SLDRAM is found to have a unsatisfactory refresh characteristic, a refresh instruction for the SLDRAM can be given at shorter cycle than is normally performed, whereby the normal operation of SLDRAM is allowed.

In this embodiment, though all addresses of defective bits are stored in defective address register 26, if an entire bank is defective, the number of defective bits becomes too large to be stored in defective address register 26, or the address allocating process of memory controller 3 may slow and system efficiency may be degraded. To deal with this problem, when the number of defective bits in a bank is too large, built in test circuit 25 may store a defect mode indicating a bank defect to the defective address register, the number of defective banks and defective bank address in defective address register 26. The information is sent out to data bus 12 as a packet.

FIG. 15 is a diagram showing a test result data packet at the time of bank defect. This packet starts from a test result showing the number of defective banks followed by an address of the defective bank. Receiving the packet, memory controller 3 accesses to a normal bank of the SLDRAM. Therefore even when a bank becomes defective in the SLDRAM, the SLDRAM can be effectively used without replacement.

In addition, an SLDRAM can be effectively utilized dealing with defects corresponding to a single word line or a single column select line. For example, when a word line is defective, 16 bits indicating column address in the test result data packet shown in FIG. 10 will be made all "1" and when a column select line is defective, 16 bits indicating row address in the test result data packet will be turned to all "1". As far as the bit number of row address and column address do not exceed the bit width of the data bus, this procedure is applicable.

Figure 16:
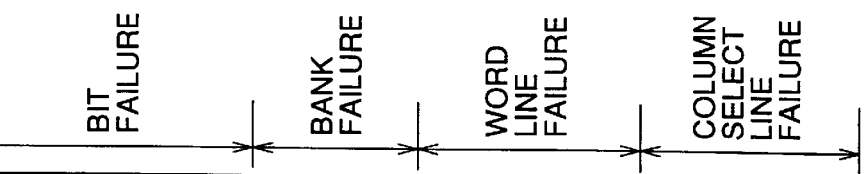
FIG. 16 is a diagram showing still another variation of the first embodiment.

Further as shown in FIG. 16, a plurality of failure results can be transferred to the controller only by one test result data packet by making the first data row of the test result data packet indicate the numbers of plurality of failures. In FIG. 16, the number of defective bits, the number of defective banks, the number of defective word lines and the number of defective column select lines are each indicated by four bits in the first sixteen-bit data and their addresses are indicated by the second and following data rows.

Second Embodiment

One technique for improving the data transfer efficiency is known in which data compression/decompression logic sections are equipped together on an SLDRAM without changing an interface of the SLDRAM and a compressed data is transferred to data bus 12 (ISSCC98/SESSION21/ MEMORY:NV AND EMBEDDED/PAPER SA21.6). The present invention can be applied to such a mixed logic SLDRAM.

Figure 17:
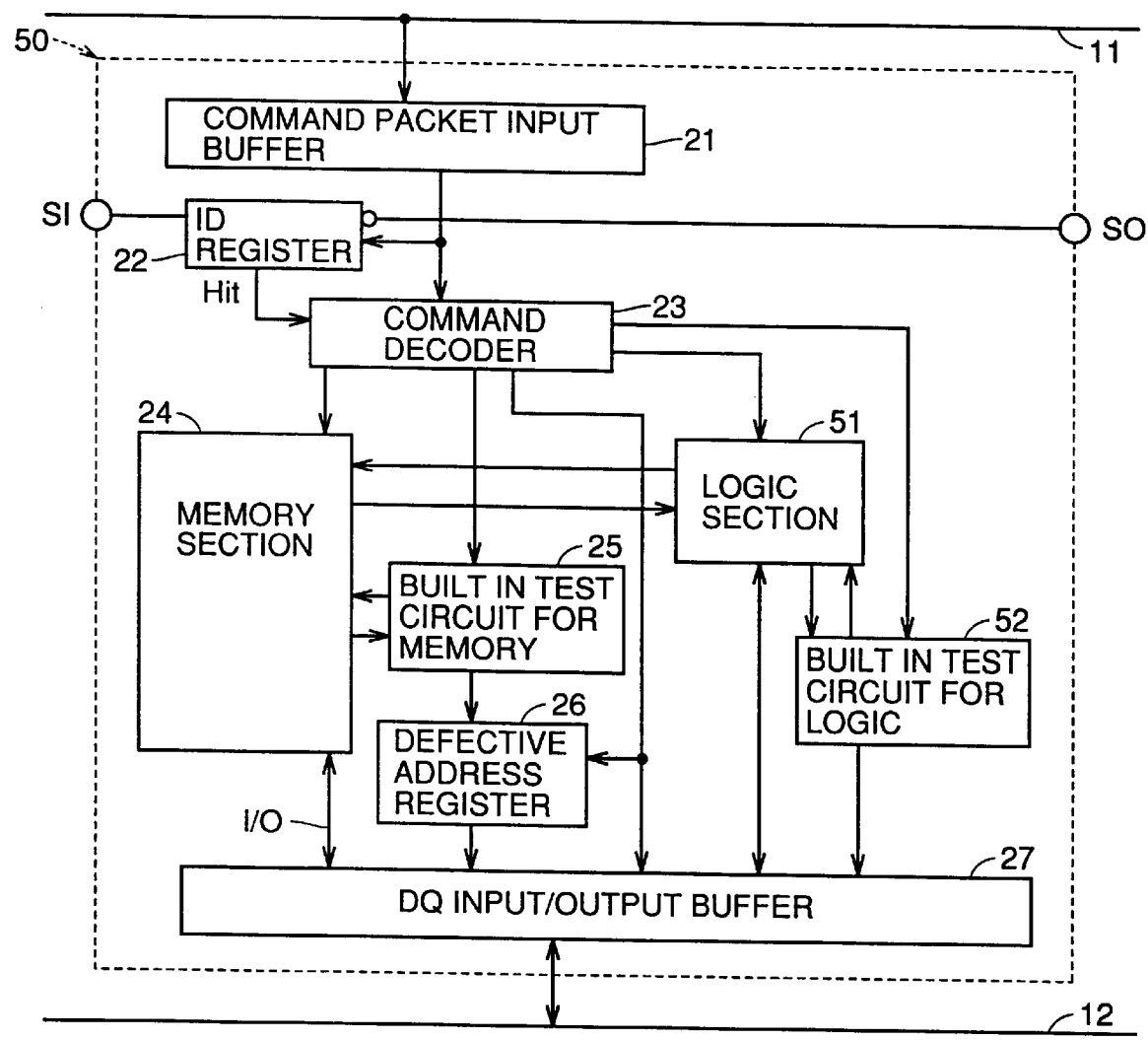
FIG. 17 is a block diagram showing a main portion of an SLDRAM employed in a computer system in accordance with a second embodiment of the present invention.

FIG. 17 is a block diagram showing the main portion of an SLDRAM 50 employed in a computer system of the second embodiment of the present invention, comparable to FIG. 6.

With reference to FIG. 17, SLDRAM 50 is different from SLDRAM 5.n of FIG. 6 in that a logic section 51 and a built in test circuit 52 for logic section are newly provided.

Logic section 51, controlled by command decoder 23, compresses and writes data supplied from DQ input/output buffer 27 into memory section 24 at the writing operation and decompresses and supplies a compressed data read out from memory section 24 to DQ input/output buffer 27 at the reading operation. Built in test circuit 52 is controlled by command decoder 23 and performs a test for logic section 51.

Memory section 24 and logic section 51 are separately usable from memory controller 3 side. Data can be transmitted between DQ input/output buffer 27 and memory section 24 without using logic section 51. In addition, logic section 51 can compress or decompress data supplied from DQ input/output buffer 27 and send the data back to DQ input/output buffer 27.

At the time of test execution, memory controller 3 issues a command packet as in the first embodiment and a mixed logic SLDRAM 50 having the same ID value as an ID value in the packet starts an internal test.

As shown in FIG. 18, in a test execution command portion of the command packet, informations on which of memory selection 24 and logic section 51 is to be tested is included. When memory section 24 is tested, the number of defective bits or the number of defective banks and the corresponding defective address are detected as in the first embodiment and information is sent back to memory controller 3 as a test result. At the test of logic section 24, logic section 24 is tested and the information on whether it is normal or not is sent back to memory controller 3.

As an example of a test for data compression/ decompression logic section 51 the following procedure is conceivable. First, data 1 stored in test circuit 52 for compression test is supplied as an input to a compression circuit of logic section 51. If the result matches with a compressed data of expected value 2 stored in test circuit 52, it is determined to be normal. Conversely, for testing a decompression circuit of logic section 51, data 2 is supplied as an input and a result may be compared with data 1.

When the present invention is applied to a mixed logic SLDRAM, the mixed logic SLDRAM can effectively be utilized by using it as a memory device when logic section 51 is defective and memory section 24 is normal, or as a logic device when entire memory section 24 is defective and logic section 51 is normal, or as a mixed logic memory by using only a normal portion when a part of memory section 24 is defective.

Though in this embodiment, the tests for memory section 24 and logic section 51 are separately performed, tests for these sections can be performed at the same time. Then in the test result data packet, as shown in FIG. 19, the test result of memory section 24 is first output and then the test result of logic section 51 is output. The test result of logic section 51 is indicated by all 0 when it is normal or all 1 when it is defective, for example. In addition, failure modes such as an undesirable fluctuation of the power supply bounds, an excessively long access time, timing error and so on can be indicated by a 16-bit data.

Figure 21:
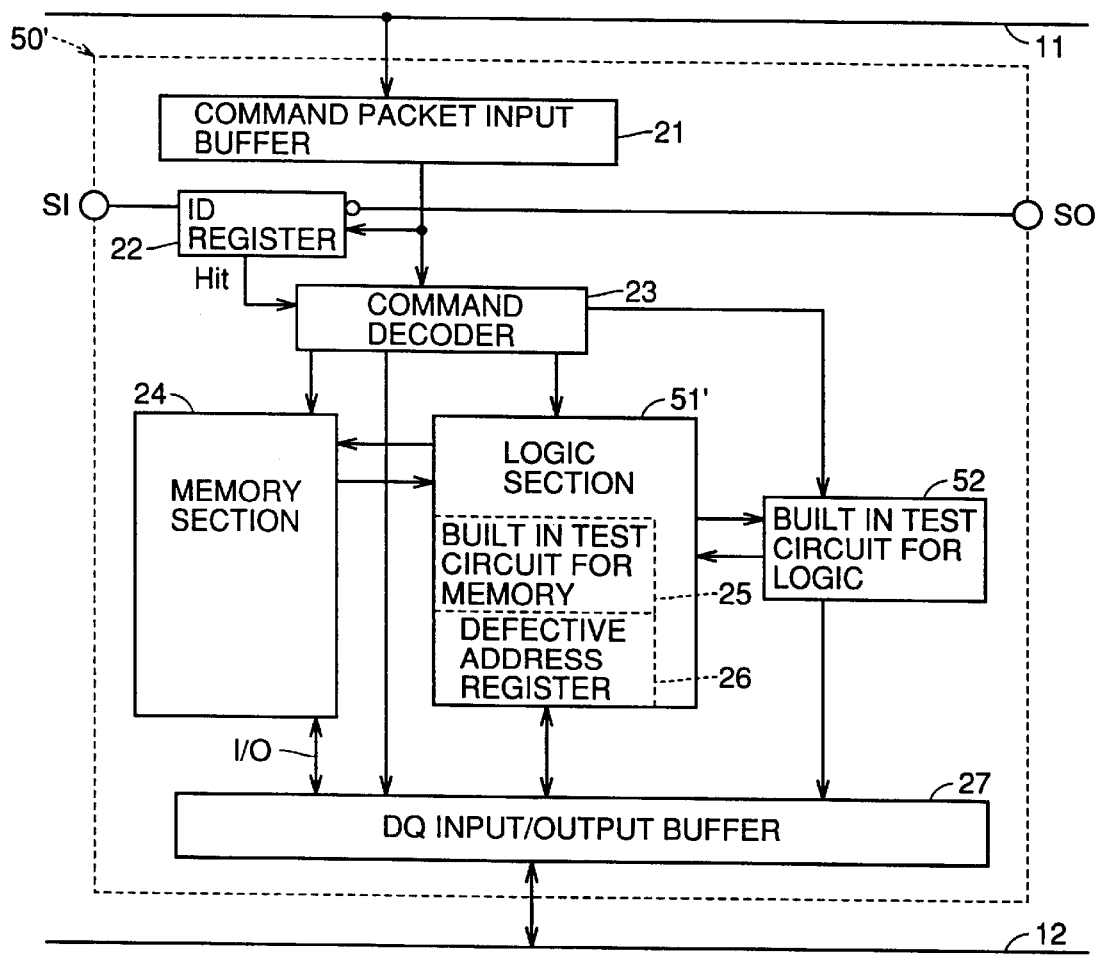
FIG. 21 is a block diagram showing another variation of the second embodiment.

In addition, if logic section 51 can be divided into a plurality of internal logic circuits, a test can be performed for each one of the internal logic circuits. FIG. 20 shows an example of a packet indicating test results of the plurality of internal logic circuits. The test result of each internal logic circuit is indicated as a 16-bit data. Further as shown in FIG. 21, logic section 51 may include a built in test circuit 25 for a memory and a defective address register 26. Then, a logic section 51' tests memory section 24 in response to a command packet from memory controller 3 and transfers a result to memory controller 3 via data bus 12. Based on the test result, memory controller 3 effectively utilizes an SLDRAM.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor memory device connected to a memory controller, comprising:
   a memory circuit including a plurality of memory cells each having a preallocated unique address;
   a read/write circuit reading/w riting data frominto a memory cell corresponding to an address in response to a read/write command and the address supplied from said memory controller; and
   a first test circuit testing each memory cell in said memory circuit to determine whether the memory cell is normal or not, in response to a first test execution command supplied from said memory controller, and supplying a test result information including an address of a defective memory cell to said memory controller.

2. The semiconductor memory device according to claim 1, wherein said test result information further includes a number of defective memory cells.

3. The semiconductor memory device according to claim 1, wherein said first test circuit temporarily stores said test result information, and outputs said test result information to said memory controller in response to a test result output command supplied from said memory controller.

4. The semiconductor memory device according to claim 1, further comprising:
   a logic circuit processing data betwee n said memory controller and said memory circuit; and
   a second test circuit, testing said logic circuit to determine whether the logic circuit is normal or not in response to a second test execution command supplied from said memory controller, and supplying a test result to said memory controller;

wherein said memory circuit and said logic circuit areseparately usable for said memory controller.

5. A semiconductor memory device connected to a memory controller, comprising:
- a plurality of memory circuits each having a preallocated unique upper address, and each including a plurality of memory cells each having a preallocated unique lower address;
- a read/write circuit, reading/writing data from/into a memory cell corresponding to an upper address and a lower address in response to a read/write command, the upper address and the lower address supplied from said memory controller; and
- a first test circuit testing each memory cell in each memory circuit to determine whether the memory cell is normal or not, in response to a first test execution command supplied from said memory controller, and, supplying a test result information including an upper address of a defective memory circuit having a defective memory cell to said memory controller.

6. The semiconductor memory device according to claim 5, wherein said test result information further includes a number of defective memory circuits.

7. The semiconductor memory device according to claim 5, wherein said first test circuit temporarily stores said test result information and, outputs said test result information to said memory controller in response to a test result output command supplied from said memory controller.

8. The semiconductor memory device according to claim 5, further comprising:
- a logic circuit processing data between said memory controller and said memory circuit; and
- a second test circuit testing said logic circuit to determine whether the logic circuit is normal or not in response to a second test execution command supplied from said memory controller, and supplying a test result to said memory controller;
- wherein said memory circuit and said logic circuit are separately usable for said memory controller side.

9. A memory system comprising a semiconductor memory device and a memory controller for controlling the semiconductor memory device, said semiconductor memory device including:
- a memory circuit having a plurality of memory cells each having a preallocated unique address;
- a read/write circuit, reading/writing data from/into a memory cell corresponding to an address in response to a read/write command and the address supplied from said memory controller; and
- a first test circuit testing each memory cell in said memory circuit to determine whether the memory cell is normal or not in response to a first test execution command supplied from said memory controller, and supplying a test result information including an address of a defective memory cell to said memory controller,
- wherein said memory controller does not access to the defective memory cell in said memory circuit and accesses only to a normal memory cell, based on the test result information supplied from said first test circuit.

10. The memory system according to claim 9, wherein said test result information further includes a number of defective memory cells.

11. The memory system according to claim 9, wherein said memory controller includes;
- a register for storing the test result information supplied from said first test circuit, and
- an address generation circuit producing only an address corresponding to a normal memory cell in said memory circuit based on an externally supplied external address and the test result information stored in said register, and supplying the address to said read/write circuit.

12. The memory system according to claim 9, wherein said first test circuit temporarily stores said test result information and outputs said test result information to said memory controller in response to a test result output command supplied from said memory controller.

13. The memory system according to claim 9, wherein said semiconductor memory device further include
- a logic circuit processing data between said memory controller and said memory circuit, and
- a second test circuit testing said logic circuit to determine whether the logic circuit is normal or not in response to a second test execution command supplied from said memory controller, and supplying a test result to said memory controller,
- wherein said memory circuit and said logic circuit are separately usable for said memory controller.

14. The memory system according to claim 9, comprising a plurality of said semiconductor memory devices, each having an allocated unique identifier, wherein
- each semiconductor memory device is activated in response to a corresponding identifier supplied from said memory controller.

15. A semiconductor memory device, comprising:
- a memory circuit including a plurality of memory cells each specified by an externally applied address signal;
- a read/write circuit reading/writing data from/to a memory cell specified by said address signal, in response to an externally applied read/write command and said address signal;
- a built-in test circuit to an externally applied test execution command to detect a defective memory cells in said memory circuit; and
- a defective address register receiving and holding a result of detection from said built-in test circuit.

16. The semiconductor memory device according to claim 15, wherein said defective address register holds the number of defective memory cells.

17. The semiconductor memory device according to claim 15, wherein said defective address register holds an address signal corresponding to a defective memory cell.

18. The semiconductor memory device according to claim 15, further comprising:
- a data input/output terminal for transmitting/receiving data between said read/write circuit and the outside at the time of a data reading/writing operation from/to said memory cell; wherein
- the result of detection held by said defective address register is output externally through said data input/output terminal, in synchronization with a clock signal.

* * * * *

UNITED STATES PATENT AND TRADEMARK OFFICE
CERTIFICATE OF CORRECTION

PATENT NO. : 6,304,502 B1
DATED : October 16, 2001
INVENTOR(S) : Naoya Watanabe et al.

It is certified that error appears in the above-identified patent and that said Letters Patent is hereby corrected as shown below:

Column 12, claim 1,
Line 41, replace "reading/w riting" to -- reading/writing --
Line 41, replace "frominto" to -- from/into --

Column 12, claim 4,
Line 61, replace "betwee n" to -- between --

Column 13, claim 4,
Line 2, replace "ar eseparately" to -- are separately --

Signed and Sealed this

Ninth Day of April, 2002

Attest:

Attesting Officer

JAMES E. ROGAN
Director of the United States Patent and Trademark Office